(12) United States Patent
Ku

(10) Patent No.: US 7,915,934 B2
(45) Date of Patent: Mar. 29, 2011

(54) DELAY LOCKED LOOP CIRCUIT AND OPERATIONAL METHOD THEREOF

(75) Inventor: Young-Jun Ku, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 31 days.

(21) Appl. No.: 12/427,028

(22) Filed: Apr. 21, 2009

(65) Prior Publication Data

US 2010/0164566 A1 Jul. 1, 2010

(30) Foreign Application Priority Data

Dec. 26, 2008 (KR) .................. 10-2008-0134939

(51) Int. Cl.
*H03L 7/06* (2006.01)
(52) U.S. Cl. ......... 327/158; 327/144; 327/149; 327/152
(58) Field of Classification Search .................. 327/141, 327/144–163; 331/15–17, 1 A; 375/373–376
See application file for complete search history.

(56) References Cited

U.S. PATENT DOCUMENTS

| 7,639,552 B2 * | 12/2009 | Ku ................................. 365/194 |
| 2004/0066873 A1 * | 4/2004 | Cho et al. ...................... 375/376 |
| 2006/0001463 A1 * | 1/2006 | Lee et al. ...................... 327/147 |
| 2009/0115471 A1 * | 5/2009 | Choi .............................. 327/149 |
| 2009/0115475 A1 * | 5/2009 | Oh ................................ 327/158 |
| 2009/0256604 A1 * | 10/2009 | Ku ................................ 327/158 |
| 2009/0322390 A1 * | 12/2009 | Shim ............................ 327/158 |

FOREIGN PATENT DOCUMENTS

| KR | 100815185 | 3/2008 |
| KR | 100857855 | 9/2008 |
| KR | 102008008815 | 10/2008 |

* cited by examiner

*Primary Examiner* — Lincoln Donovan
*Assistant Examiner* — Brandon S Cole
(74) *Attorney, Agent, or Firm* — IP & T Group LLP

(57) ABSTRACT

A delay locked loop circuit includes a clock buffering block to generate first and second internal clocks corresponding to first and second edges of a source clock in response to a clock buffering control signal, respectively, wherein generation of the second internal clock is controlled by a duty correcting operation terminating signal and a delay locking signal, a delay locking block to compare phases of the first and second internal clocks with those of first and second feedback clocks, respectively, to enable the delay locking signal according to a delay locking and delay the first and second internal clocks as many as times corresponding to the comparison results, respectively, thereby outputting first and second delay locking clocks, a duty correcting block to mix phases of the first and second delay locking clocks, and a first signal generating block to generate the duty correcting operation terminating signal.

30 Claims, 3 Drawing Sheets

DELAY LOCKED LOOP CIRCUIT AND OPERATIONAL METHOD THEREOF

CROSS-REFERENCE TO RELATED APPLICATIONS

The present invention claims priority of Korean patent application number 10-2008-0134939, filed on Dec. 26, 2008, the disclosure of which is incorporated by reference herein in its entirety.

BACKGROUND OF THE INVENTION

The present invention relates to semiconductor design technology, and more particularly, to a delay locked loop circuit of a semiconductor memory device.

In general, input/output data should be timely synchronized with a reference clock in a synchronous semiconductor memory device such as a double data rate synchronous dynamic random access memory device (DDR SDRAM).

Herein, since the reference clock mainly represents an external clock CLK, CLKB inputted from an external device such as a memory controller, in order to transmit data that is timely synchronized with the reference clock, a point in time where the data transmitted from the synchronous semiconductor memory device is outputted and an edge or a center of the external clock CLK, CLKB should be exactly in accord with each other.

However, as can be seen from an example of an asynchronous semiconductor memory device, although a command for outputting data and the external clock CLK, CLKB are inputted to a general semiconductor memory device, data that is timely synchronized with the external clock CLK, CLKB is not automatically outputted.

The reason why the data is not synchronized with the external clock CLK, CLKB in the semiconductor memory device is as follows.

First of all, if the external clock CLK, CLKB that is buffered into the semiconductor memory device through an input buffering circuit is called an internal clock, a phase of the internal clock is changed as the internal clock passes through all internal circuits included in the semiconductor memory device such as control circuits, peripheral circuits, a cell array and so on. Therefore, the internal clock is not timely synchronized with the external clock CLK, CLKB when the internal clock arrives at an output buffering circuit and is outputted to the external.

At this time, since the data is outputted from the semiconductor memory device by being synchronized with the internal clock, the data outputted from the semiconductor memory device is not synchronized with the external clock CLK, CLKB due to a phase difference between the internal clock and the external clock CLK, CLKB.

Therefore, in order to output data being timely synchronized with a phase of the external clock CLK, CLKB that is a standard in the semiconductor memory device, a time, by which the internal clock is delayed until the external clock CLK, CLKB inputted as the internal clock is transferred to an output pad should be conversely compensated to the internal clock coupled to the output pad to make the phase of the internal clock being synchronized with the phase of the external clock CLK, CLKB.

As described above, a representative circuit that performs a function of synchronizing the phase of the internal clock with the phase of the external clock CLK, CLKB by conversely compensating the time by which the phase of the internal clock is delayed is a phase locked loop (PLL) circuit and a delay locked loop (DLL) circuit.

The PLL circuit is a device mainly used to simultaneously synchronize a frequency and a phase using a frequency multiplication function in case that a frequency of the internal clock used within the semiconductor memory device becomes different from a frequency of the external clock inputted from the external as a standard.

Meanwhile, the DLL circuit is a device used to synchronize only a frequency in case that the frequency of the internal clock is the same as that of the external clock.

Like this, since the PLL circuit has an additional function such as the frequency multiplication function compared to the DLL circuit when comparing only features of the PLL circuit and the DLL circuit, the PLL circuit is supposed to be used more often than the DLL circuit. However, the DLL circuit is practically used more often than the PLL circuit in case of the semiconductor memory device.

There are various reasons therefor. The representative reason is that the DLL circuit is stronger than the PLL circuit against noise and the DLL circuit requires a much smaller area than the PLL circuit.

FIG. 1 illustrates a block diagram of a DLL circuit in a conventional semiconductor memory device.

Referring to FIG. 1, the conventional DLL circuit includes a delay locking block 100, a phase detecting block 120 and a phase mixing block 140.

The delay locking block 100 generates a first delay clock RISING_CLK corresponding to a first clock edge of a source clock REF_CLK and a second delay clock FALLING_CLK corresponding to a second clock edge of the source clock REF_CLK to achieve the delay locking.

The phase detecting block 120 outputs a weight selection signal WR_SEL by detecting a phase difference between the first delay clock RISING_CLK and the second delay clock FALLING_CLK.

The phase mixing block 140 outputs delay locked loop clocks DLL_CLK_USE and DLL_CLK_DUMMY by reflecting a weight corresponding to the weight selection signal WR_SEL to the first delay clock RISING_CLK and the second delay clock FALLING_CLK at a point in time where the first delay clock RISING_CLK and the second delay clock FALLING_CLK are delay-locked and mixing phases of the first delay clock RISING_CLK and the second delay clock FALLING_CLK.

The conventional DLL circuit further includes a phase split block 110A for generating first and second phase split clocks RCLKDLL and FCLKDLL by splitting phases of the delay locked loop clocks DLL_CLK_USE and DLL_CLK_DUMMY and a dummy phase split block 110B that has the same construction as that of the phase split block 110A but does not operate practically.

The phase mixing block 140 includes a delay locking enable signal generating sector 146, a mixing control sector 142, a duty cycle correction (DCC) phase mixing sector 144 and a dummy DCC phase mixing sector 145.

The delay locking enable signal generating sector 146 generates a delay locking enable signal DCC_EN whose logic level is determined in response to a first delay locking signal LOCK_STATE_R corresponding to whether the first delay clock RISING_CLK is delay-locked or not and a second delay locking signal LOCK_STATE_F corresponding to whether the second delay clock FALLING_CLK is delay-locked.

The mixing control sector 142 generates a mixing control signal CTRL to control a mixing ratio of the first delay clock RISING_CLK and the second delay clock FALLING_CLK in response to the weight selection signal WR_SEL when the delay locking enable signal DCC_EN is enabled.

The DCC phase mixing sector 144 outputs the delay locked loop clock DLL_CLK_USE by mixing the phases of the first delay clock RISING_CLK and the second delay clock FALLING_CLK in the mixing ratio corresponding to the mixing control signal CTRL.

The dummy DCC phase mixing sector 145 has the same construction as that of the DCC phase mixing sector 144 but does not operate practically.

The delay locking block 100 includes a first phase delay sector 102, a second phase delay sector 104, a first delay duplication modeling sector 103 and a second delay duplication modeling sector 105. Furthermore, the delay locking block 100 includes a clock buffering sector 106.

The first phase delay sector 102 outputs the first delay clock RISING_CLK by delaying a first clock CLK_IN_R corresponding to the first clock edge of the source clock REF_CLK as much as a time determined by comparing phases of the source clock REF_CLK and a first feedback clock FEB_CLK1 to achieve the delay locking.

The second phase delay sector 104 outputs the second delay clock FALLING_CLK by delaying a second clock CLK_IN_F corresponding to the second clock edge of the source clock REF_CLK as much as a time determined by comparing phases of the source clock REF_CLK and a second feedback clock FEB_CLK2.

The first delay duplication modeling sector 103 outputs the first feedback clock FEB_CLK1 by reflecting a practical delay condition of the first clock CLK_IN_R to the delay locked loop clock DLL_CLK_USE.

The second delay duplication modeling sector 105 outputs the second feedback clock FEB_CLK2 by reflecting a practical delay condition of the second clock CLK_IN_F to a dummy delay locked loop DLL_CLK_DUMMY.

The clock buffering sector 106 outputs the source clock REF_CLK and the first and second clocks CLK_IN_R and CLK_IN_F by buffering the external clock CLK, CLKB inputted thereto from the external.

Herein, the first phase delay sector 102 among the components of the delay locking block 100 includes a first phase comparing unit 1022 for generating a first delay control signal DELAY_CON1 by comparing the phases of the source clock REF_CLK and the first feedback clock FEB_CLK1 and a first delay line 1024 for outputting the first delay clock RISING_CLK by delaying the first clock CLK_IN_R as much as a time determined corresponding to the first delay control signal DELAY_CON1.

The second phase delay sector 104 among the components of the delay locking block 100 includes a second phase comparing unit 1042 for generating a second delay control signal DELAY_CON2 by comparing the phases of the source clock REF_CLK and the second feedback clock FEB_CLK2 and a second delay line 1044 for outputting the second delay clock FALLING_CLK by delaying the second clock CLK_IN_F as much as a time determined corresponding to the second delay control signal DELAY_CON2.

Hereinafter, an operation of the conventional DLL circuit will be described with reference to the construction thereof.

An operation of the delay locking block 100 of the conventional semiconductor memory device may be classified into 'an operation of before delay locked' and 'an operation of after delay locked'. As described above, a difference between the two classified operations is whether or not phases of the first and second delay clocks RISING_CLK and FALLING_CLK outputted from the delay locking block 100 are within a predetermined range. That is, if the phases of the first and second delay clocks RISING_CLK and FALLING_CLK are not within the predetermined range, it means that the delay locking is not achieved and this may be called 'before delay locked'. On the other hand, if the phases of the first and second delay clocks RISING_CLK and FALLING_CLK are within the predetermined range, it means that the delay locking is achieved and this may be called 'after delay locked'.

In particular, since all of the source clock REF_CLK and the first and second clocks CLK_IN_R and CLK_IN_F are generated by buffering the external clock CLK, CLKB, all of the source clock REF_CLK and the first and second clocks CLK_IN_R and CLK_IN_F are identical at a point in time where the DLL circuit of the semiconductor memory device starts to operate in a state of 'before delay locked'.

But, since the first and second clocks CLK_IN_R and CLK_IN_F are delayed as much as predetermined initial delay times by passing through the first and second delay lines 1024 and 1044, respectively, and controlled and outputted to have phases contrary to each other, there occurs a phase difference between the source clock REF_CLK and the first and second delay clocks RISING_CLK and FALLING_CLK.

That is, the first delay clock RISING_CLK has a rising edge after a time corresponding to its initial delay time is passed from a point in time corresponding to a first edge, e.g., a rising edge, of the source clock REF_CLK and the second delay clock FALLING_CLK has a rising edge after a time corresponding to its initial delay time is passed from a point in time corresponding to a second edge, e.g., a falling edge, of the source clock REF_CLK.

After then, the first delay clock RISING_CLK is delayed as much as a time preset in the first delay duplication modeling sector 103 and outputted as the DLL circuit of the semiconductor memory device starts to operate. At this time, the time preset in the first delay duplication modeling sector 103 is identical to a delay time generated as the first clock CLK_IN_R passes through internal components of the semiconductor memory device such as control circuits, peripheral circuits, a cell array an so on.

Likewise, the second delay clock FALLING_CLK is delayed as much as a time preset in the second delay duplication modeling sector 105 and outputted. At this time, the time of delaying the first delay clock RISING_CLK in the first delay duplication modeling sector 103 is the same as the time of delaying the second delay clock FALLING_CLK in the second delay duplication modeling sector 105. That is, the delay time generated as the first clock CLK_IN_R passes through the internal components of the semiconductor memory device is identical to that generated as the second clock CLK_IN_F passes through internal components of the semiconductor memory device.

In the meantime, as shown in FIG. 1, it is noticed that the first and second delay duplication modeling sectors 103 and 105 are provided with not the first and second delay clocks RISING_CLK and FALLING_CLK but the delay locked loop clock DLL_CLK_USE and the dummy delay locked loop clock DLL_CLK_DUMMY outputted from the phase mixing block 140, respectively. This is because the phase mixing block 140 is a component operating only in a state of 'after delay locked' without operating in the state of 'before delay locked'.

Namely, the phase mixing block 140 operates as a bypass of outputting signals inputted thereto themselves in the state of 'before delay locked' and finally performs a phase mixing operation for the input signals in the state of 'after delay locked'.

Therefore, in the state of 'before delay locked', the first and second delay clocks RISING_CLK and FALLING_CLK inputted to the phase mixing block 140 may be the same as the delay locked loop clock DLL_CLK_USE and the dummy delay locked loop clock DLL_CLK_DUMMY outputted from the phase mixing block 140, respectively.

The conventional DLL circuit of the semiconductor memory device operates to change clocks in the state of 'before delay locked' having states described above as follows until the state of 'before delay locked' is terminated.

First of all, the rising edge of the first delay clock RISING_CLK outputted from the first delay line 102_4 is delay-locked with the rising edge of the reference clock REF_CLK by further delaying the first clock CLK_IN_R, which is used to be delayed by its initial delay time, as much as a first predetermined time through appropriately controlling the first delay line 102_4.

At the same time, the rising edge of the second delay clock FALLING_CLK outputted from the second delay line 104_4 is delay-locked with the rising edge of the reference clock REF_CLK by further delaying the second clock CLK_IN_F, which is used to be delayed by its initial delay time, as much as a second predetermined time through appropriately controlling the second delay line 104_4.

Herein, a delay amount of the first delay line 102_4 delaying the first clock CLK_IN_R is different from that of the second delay line 104_4 delaying the second clock CLK_IN_F. That is, the first predetermined time is different from the second predetermined time.

As described above, if the first delay locking signal LOCK_STATE_R is enabled as the rising edge of the first delay clock RISING_CLK is synchronized with the rising edge of the reference clock REF_CLK and the second delay locking signal LOCK_STATE_F is enabled as the rising edge of the second delay clock FALLING_CLK is synchronized with the rising edge of the reference clock REF_CLK, the delay locking enable signal DCC_EN is enabled and thus the state of 'before delay locked' is terminated.

Then, the semiconductor memory device operates as the state of 'after delay locked'. At this time, the phase mixing block 140 among the components of the DLL circuit does not operate as the bypass and performs the operation of mixing the phases of the first and second delay clocks RISING_CLK and FALLING_CLK. As a result, a duty ratio of the delay locked loop clock DLL_CLK_USE outputted from the phase mixing block 140 is corrected to 50:50.

Referring back to the reason why the aforementioned DLL circuit exists, the DLL circuit is required to synchronize the phase of the internal clock with that of the external clock by conversely compensating the delay time of the phase of the internal clock occurring by the operation of the semiconductor memory device.

That is, if the state of 'before delay locked' is terminated, the delay locked loop clocks DLL_CLK_USE and DLL_CLK_DUMMY and the reference clock REF_CLK are in a state of their rising edges being synchronized with each other, wherein the delay locked loop clocks DLL_CLK_USE and DLL_CLK_DUMMY are the same as the first and second delay clocks RISING_CLK and FALLING_CLK at the point in time where the state of 'before delay locked' is terminated and the reference clock REF_CLK is the external clock. Therefore, practically, the operation of the DLL circuit should be terminated at the same time of the termination of the state of 'before delay locked'.

A recent semiconductor memory device tends to output more than two data during one period of an internal clock while an early semiconductor memory device outputs one data during one period of the internal clock.

For instance, a semiconductor memory device, which outputs one data at a rising edge of the delay locked loop clock DLL_CLK_USE and one data at a falling edge thereof, such as a DDR SDRAM device, a DDR2 SDRAM device, a DDR3 SDRAM device and so on has been developed.

At this time, if a logic high period from a point in time where the rising edge of the internal clock occurs to a point in time where the falling edge thereof occurs is relatively long and a logic low period from a point in time where the falling edge of the internal clock occurs to a point in time where the rising edge thereof occurs is relatively short, a sufficient time is provided to a data input/output operation during the logic high period but a sufficient time is not provided to a data input/output operation during the logic low period, so that there may occur a failure in the data input/output operation.

Therefore, an operation of correcting a duty ratio of the delay locked loop clock DLL_CLK_USE should be performed at an ending part of the DLL circuit.

Referring to a detailed operation of the phase mixing block 140 in the state of 'after delay locked', a logic high period of the first delay clock RISING_CLK is consistent with a logic high period of the reference clock REF_CLK and a logic high period of the second delay clock FALLING_CLK is consistent with to a logic low period of the reference clock REF_CLK. Further, since the phases of the first delay clock RISING_CLK and the second delay clock FALLING_CLK are in the synchronized state in the state of 'before delay locked', the phase detecting block 120 performs an operation of generating the weight control signal WR_SEL by comparing a falling edge point of the first delay clock RISING_CLK with a falling edge point of the second delay clock FALLING_CLK.

Then, the mixing control sector 142 properly controls a value of the mixing control signal CTRL to make the DCC phase mixing sector 144 mix the phases of the first and second delay clocks RISING_CLK and FALLING_CLK with a weight corresponding to the weight control signal WR_SEL.

Through the above processes, the DCC phase mixing sector 144 generates the delay locked loop clock DLL_CLK_USE having a duty ratio of 50:50.

After then, the phase split block 110A generates the first split clock RCLKDLL corresponding to a first edge, e.g., a rising edge, of the delay locked loop clock DLL_CLK_USE and the second split clock FCLKDLL corresponding to a second edge, e.g., a falling edge, of the delay locked loop clock DLL_CLK_USE by splitting the delay locked loop clock DLL_CLK_USE whose duty ratio is corrected to 50:50.

At this time, the dummy DCC phase mixing sector 145 and the dummy phase split block 110B are not required to operate since they are only used to bypass the first and second delay clocks RISING_CLK and FALLING_CLK inputted to the phase mixing block 140 in the state of 'before delay locked' in the same transmission environment as in the DCC phase mixing sector 144 and the phase split block 110A by becoming a load having a resistance value corresponding to a resistance value which the components constructing the DCC phase mixing sector 144 and the phase split block 110A have. Therefore, the dummy DCC phase mixing sector 145 and the dummy phase split block 110B only perform the bypass operation in the state of 'before delay locked' and they do not perform any operation in the state of 'after delay locked'.

Through the above described the operation of 'before delay locked' and the operation of 'after delay locked' of the DLL circuit, the delay locked loop clock DLL_CLK_USE achieving two objects described below is generated.

Since the first object is to conversely compensate the internal clock to allow data outputted from the semiconductor memory device to be synchronized with the external clock, it is achieved in the state of 'before delay locked' of the DLL circuit.

Meanwhile, since the second object is to output data at the first edge of the internal clock as well as at the second edge thereof by exactly correcting the duty ratio of the internal clock to 50:50, it is achieved in the state of 'after delay locked' of the DLL circuit.

In order to accomplish the two objects, the conventional DLL circuit described in FIG. 1 employs a dual loop scheme. The main reason using the dual loop scheme is to exactly correct the duty ratio of the internal clock to 50:50, which is the second object of the two objects.

Namely, while the first object that is to conversely compensate the internal clock can be easily accomplished by using a DLL circuit employing a single loop scheme, the second object, i.e., making the duty ratio of the internal clock have exactly 50:50, cannot be easily accomplished by using the DLL circuit employing the single loop scheme. Although the second object is achieved using the DLL circuit employing the single loop scheme, its accuracy may be substantially lower than that of the DLL circuit employing the dual loop scheme.

Thus, the DLL circuit using the dual loop scheme has been usually used in the semiconductor memory device.

In the DLL circuit employing the dual loop scheme, the phase mixing block 140 performs the operation of mixing the phases of the first delay clock RISING_CLK and the second delay clock FALLING_CLK in the state of 'after delay locked' as described above to make the duty ratio of the internal clock to exactly 50:50, which is the second object.

However, a period where the phase mixing operation of the phase mixing block 140 is exactly required in the state of 'after delay locked' is only a period where a data read operation is performed to practically output data. Therefore, although the phase mixing block 140 does not operate in an idle state where any operation including the data read operation is not performed or in a power down mode, it does not affect on the operation of the semiconductor memory device.

Nevertheless, since the phase mixing block 140 continuously performs the phase mixing operation in the state of 'after delay locked' in the conventional DLL circuit employing the dual loop scheme, unnecessary current consumption occurs.

For the reference, the biggest difference between the DLL circuit employing the dual loop scheme and the DLL circuit employing the single loop scheme is that the DLL circuit employing the single loop scheme uses one internal clock while the DLL circuit employing the dual loop scheme uses two internal clocks when delay-locking the internal clock and the external clock. This is well known in the art and therefore detailed explanation thereof is omitted.

SUMMARY OF THE INVENTION

Embodiments of the present invention are directed to provide a delay locked loop (DLL) circuit capable of performing an operation of correcting a duty ratio only in a specific mode in a state of 'after delay locked'.

In accordance with an aspect of the present invention, there is provided a delay locked loop circuit including: a clock buffering block configured to generate first and second internal clocks corresponding to first and second edges of a source clock in response to a clock buffering control signal, respectively, wherein the activation of the operation of generating the second internal clock is controlled in response to a duty correcting operation terminating signal and a delay locking signal; a delay locking block configured to compare phases of the first and second internal clocks with those of first and second feedback clocks, respectively, to enable the delay locking signal according to a delay locking, and delay the first and second internal clocks as much as times corresponding to the comparison results, respectively, thereby outputting first and second delay locking clocks; a duty correcting block configured to mix phases of the first and second delay locking clocks in an inactivation period of the duty correcting operation terminating signal; and a first signal generating block configured to generate the duty correcting operation terminating signal in response to a clock enable signal, a precharge control signal and the delay locking signal.

In accordance with another aspect of the present invention, there is provided an operational method of a delay locked loop circuit, the method including: generating first and second internal clocks corresponding to first and second edges of a source clock in response to a clock buffering control signal before a delay-locked; generating the first internal clock in response to the clock buffering control signal and the second internal clock in response to the clock buffering control signal and a duty correcting operation terminating signal after the delay-locked; generating the duty correcting operation terminating signal in response to a precharge control signal and a clock enable signal after the delay-locked; outputting first and second delay locking clocks by comparing phases of the first and second internal clocks with those of first and second feedback clocks and reflecting delay values for the delay-locked corresponding to comparison results to the first and second internal clocks, respectively; and mixing phases of the first and second delay locking clocks in an inactivation period of the duty correcting operation terminating signal.

In accordance with further aspect of the present invention, there is provided a delay locked loop circuit including: a first clock buffering block configured to generate a first internal clock corresponding to a first edge of a source clock in response to a clock buffering control signal; a second clock buffering block configured to generate a second internal clock corresponding to a second edge of the source clock in response to the clock buffering control signal, which is controlled in response to a duty correcting operation terminating signal and a delay locking signal; a first delay locking block configured to compare a phase of the first internal clock with that of a first feedback clock to enable a first locking signal according to a delay locking and output a first delay locking clock by delaying the first internal clock as much as a time corresponding to the comparison result; a second delay locking block configured to compare a phase of the second internal clock with that of a second feedback clock to enable a second locking signal according to a delay locking and output a second delay locking clock by delaying the second internal clock as much as a time corresponding to the comparison result; a duty correcting block configured to mix a phase of the first delay locking clock and that of the second delay locking clock in an inactivation period of the duty correcting operation terminating signal; a first signal generating block configured to generate the duty correcting operation terminating signal in response to a clock enable signal, a precharge control signal and the delay locking signal; and a second signal generating block configured to generate the delay locking signal in response to the first and second locking signals.

DESCRIPTION OF SPECIFIC EMBODIMENTS

Other objects and advantages of the present invention can be understood by the following description, and become apparent with reference to the embodiments of the present invention.

Figure 1:
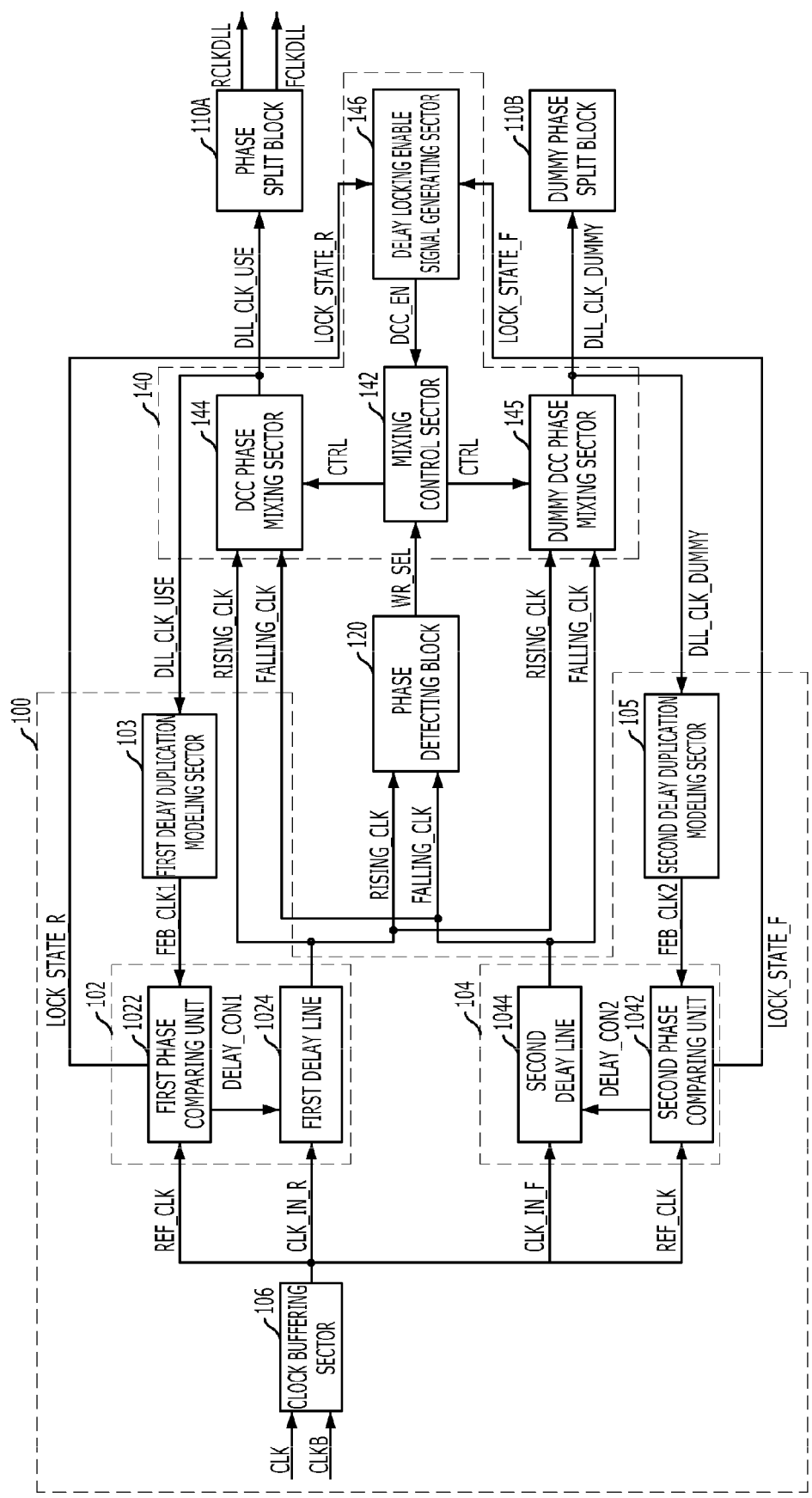
FIG. 1 illustrates a block diagram of a DLL circuit in a conventional semiconductor memory device.
Figure 2:
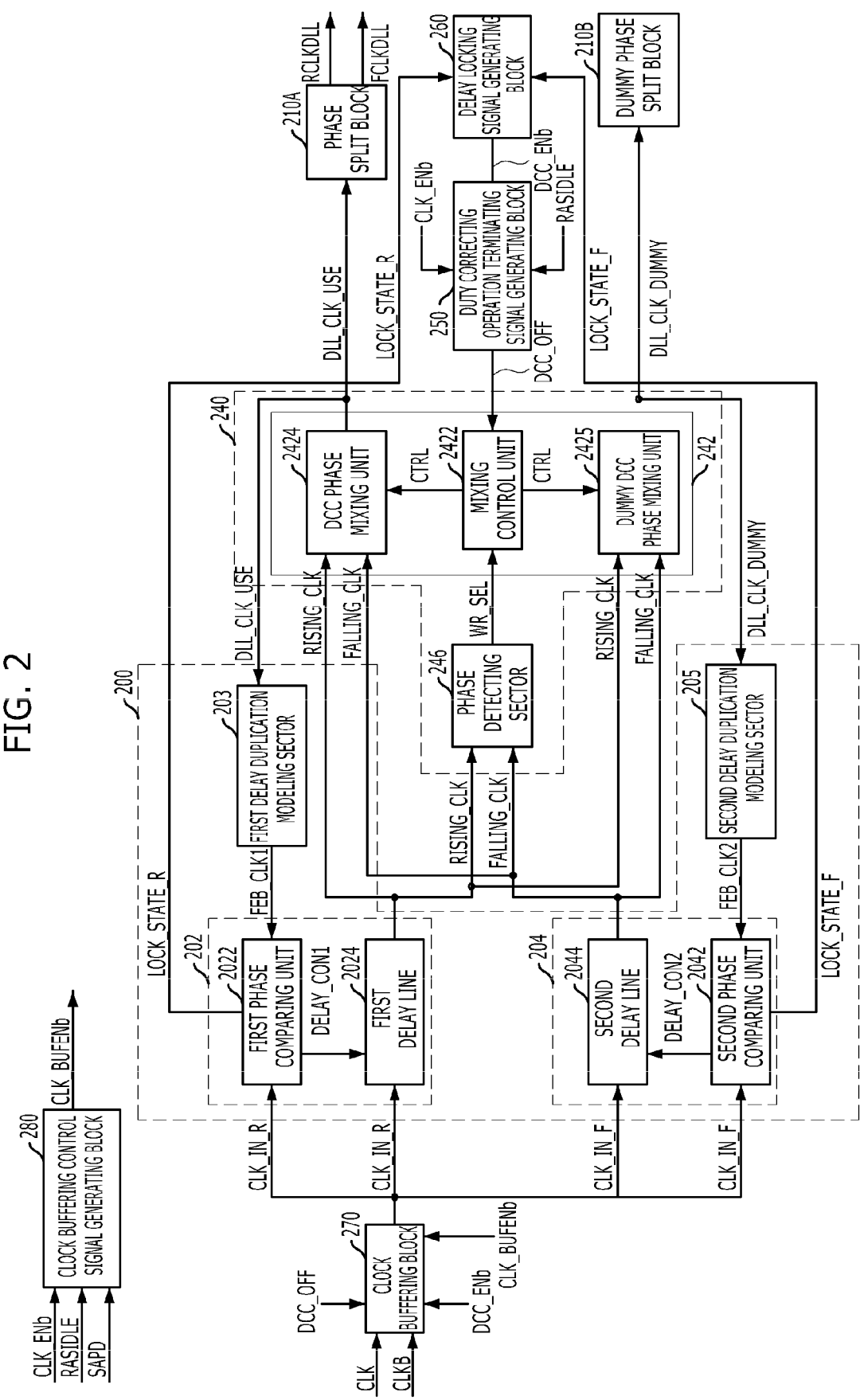
FIG. 2 illustrates a block diagram of a DLL circuit in a semiconductor memory device in accordance with an embodiment of the present invention.

FIG. 2 illustrates a block diagram of a DLL circuit in a semiconductor memory device in accordance with an embodiment of the present invention.

Referring to FIG. 2, the DLL circuit includes a clock buffering block 270, a delay locking block 200, a duty correcting block 240 and a duty correcting operation terminating signal generating block 250.

The clock buffering block 270 generates a first internal clock CLK_IN_R corresponding to a first edge of a source clock CLK, CLKB and a second internal clock CLK_IN_F corresponding to a second edge of the source clock CLK, CLKB in response to a clock buffering control signal CLK_BUFENb, wherein the operation of generating the second internal clock CLK_IN_F is controlled in response to a duty correcting operation terminating signal DCC_OFF and a delay locking signal DCC_ENb. Herein, for instance, the first edge represents a rising edge in case of the positive source clock CLK and a falling edge in case of the negative source clock CLKB and its conversion is also possible. On the other hand, the second edge represents a falling edge in case of the positive source clock CLK and a rising edge in case of the negative source clock CLKB and its conversion is also possible.

The delay locking block 200 respectively compares a phase of the first internal clock CLK_IN_R with that of a first feedback clock FEB_CLK1 and a phase of the second internal clock CLK_IN_F with that of a second feedback clock FEB_CLK2 in order to enable the delay locking signal DCC_ENb by achieving the delay locking, and outputs a first delay locking clock RISING_CLK and a second delay locking clock FALLING_CLK by respectively delaying the first internal clock CLK_IN_R and the second internal clock CLK_IN_F as much as times corresponding to the comparison results.

The duty correcting block 240 mixes phases of the first delay locking clock RISING_CLK and the second delay locking clock FALLING_CLK in an inactivation period of the duty correcting operation terminating signal DCC_OFF.

The duty correcting operation terminating signal generating block 250 generates the duty correcting operation terminating signal DCC_OFF in response to a clock enable signal CLK_ENb, a precharge control signal RASIDLE and the delay locking signal DCC_ENb.

Furthermore, the DLL circuit includes a clock buffering control signal generating block 280 for generating the clock buffering control signal CLK_BUFENb in response to the clock enable signal CLK_ENb, the precharge control signal RASIDLE and a power down mode entry control signal SAPD. The DLL circuit further includes a delay locking signal generating block 260 for generating the delay locking signal DCC_ENb in response to a first locking signal LOCK_STATE_R corresponding to whether the first delay locking clock RISING_CLK is delay-locked or not and a second locking signal LOCK_STATE_F corresponding to whether the second delay locking clock FALLING_CLK is delay-locked or not. The DLL circuit may further includes a phase split block 210A and a dummy phase split block 210B similarly to the conventional DLL circuit, but detailed description is omitted Herein, the clock enable signal CLK_ENb is a signal that is set in a mode register set (MRS) and used to control the toggling of the source clock CLK, CLKB. That is, the source clock CLK, CLKB is toggled with a predetermined frequency in an activation period of the clock enable signal CLK_ENb, whereas the source clock CLK, CLKB is fixed to a predetermined logic level without being toggled in an inactivation period of the clock enable signal CLK_ENb.

The power down mode entry control signal SAPD is a signal that is set in the MRS, enabled when the semiconductor memory device enters into the power down mode and disabled when the semiconductor memory device is relieved of the power down mode. Herein, since the power down mode is an operational mode which the semiconductor memory device enters in a certain condition to reduce current consumption and well known in the art, the detailed explanation thereof is omitted.

The precharge control signal RASIDLE is a signal that is set in the MRS, enabled when a plurality of banks included in the semiconductor memory device performs a precharge operation and disabled when the plurality of banks does not perform the precharge operation. Herein, since the precharge operation is an operation necessarily included in a typical semiconductor memory device and well known in the art, its detailed description is omitted.

Meanwhile, the delay locking block 200 includes a first phase delaying sector 202, a second phase delaying sector 204, a first delay duplication modeling sector 203 and a second delay duplication modeling sector 205, thereby enabling the first locking signal LOCK_STATE_R the second locking signal LOCK_STATE_F by achieving the delay locking.

The first phase delaying sector 202 compares the phase of the first internal clock CLK_IN_R with that of the first feedback clock FEB_CLK1 and outputs the first delay locking clock RISING_CLK by delaying the first internal clock CLK_IN_R as much as a time determined in response to the comparison result.

The second phase delaying sector 204 compares the phase of the second internal clock CLK_IN_F with that of the second feedback clock FEB_CLK2 and outputs the second delay locking clock FALLING_CLK by delaying the second internal clock CLK_IN_F as much as a time determined in response to the comparison result.

The first delay duplication modeling sector 203 outputs the first feedback clock FEB_CLK1 by reflecting a delay time of a practical output path to the first delay locking clock RISING_CLK. The second delay duplication modeling sector 205 outputs the second feedback clock FEB_CLK2 by reflecting a delay time of a practical output path to the second delay locking clock FALLING_CLK. Herein, the first delay locking clock RISING_CLK and the second delay locking clock FALLING_CLK are actually signals outputted by the duty correcting block 240, but bypass it. The detailed description is omitted, because having been illustrated in conventional DLL circuit.

The first phase delaying sector 202 among the components of the delay locking block 200 includes a first phase comparing unit 2022 for generating a first delay control signal DELAY_CON1 by comparing the phase of the first internal clock CLK_IN_R with that of the first feedback clock FEB_CLK1 and a first delay line 2024 for outputting the first delay locking clock RISING_CLK by delaying the first internal clock CLK_IN_R as much as a time determined in response to the first delay control signal DELAY_CON1.

The second phase delaying sector 204 among the components of the delay locking block 200 includes a second phase comparing unit 2042 for generating a second delay control signal DELAY_CON2 by comparing the phase of the second internal clock CLK_IN_F with that of the second feedback clock FEB_CLK2 and a second delay line 2044 for outputting the second delay locking clock FALLING_CLK by delaying the second internal clock CLK_IN_F as much as a time determined in response to the second delay control signal DELAY_CON2.

The duty correcting block 240 includes a phase detecting sector 246 for detecting a phase difference between the first delay locking clock RISING_CLK and the second delay locking clock FALLING_CLK in the inactivation period of the duty correcting operation terminating signal DCC_OFF and a phase mixing sector 242 for mixing the phases of the first delay locking clock RISING_CLK and the second delay locking clock FALLING_CLK with a mixing weight corresponding to a weight selection signal WR_SEL outputted from the phase detecting sector 246 in the inactivation period of the duty correcting operation terminating signal DCC_OFF.

Herein, the phase mixing sector 242 includes a mixing control unit 2422 for generating a mixing control signal CTRL to control a mixing ratio of the first delay locking clock RISING_CLK and the second delay locking clock FALLING_CLK in response to the weight selection signal WR_SEL in the inactivation period of the duty correcting operation terminating signal DCC_OFF, a DCC phase mixing unit 2424 for mixing the phases of the first delay locking clock RISING_CLK and the second delay locking clock FALLING_CLK in a mixing ratio corresponding to the mixing control signal CTRL and a dummy DCC phase mixing unit 2425 that has the same construction as that of the DCC phase mixing unit 2424 but does not operate practically.

For the reference, since the components that are shown in FIG. 2 but not explained directly are the same as those of the conventional DLL circuit, the explanation thereof can refer to the description of the conventional DLL circuit.

Figure 3:
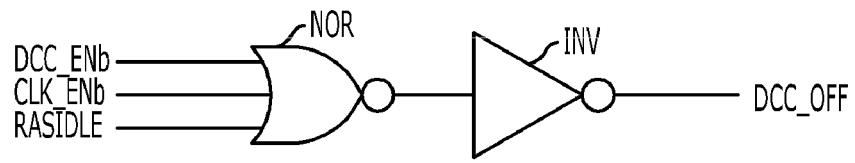
FIG. 3 illustrates a detailed circuit diagram of a duty correcting operation terminating signal generating block described in FIG. 2.

FIG. 3 illustrates a detailed circuit diagram of the duty correcting operation terminating signal generating block 250 described in FIG. 2.

Referring to FIG. 3, the duty correcting operation terminating signal generating block 250 includes a NOR gate NOR that performs a NOR operation on the clock enable signal CLK_ENb, the precharge control signal RASIDLE and the delay locking signal DCC_ENb and an inverter INV for inverting an output signal of the NOR gate NOR and outputting the inverted signal as the duty correcting operation terminating signal DCC_OFF.

Therefore, the duty correcting operation terminating signal DCC_OFF outputted from the duty correcting operation terminating signal generating block 250 has a logic high value when any one of the clock enable signal CLK_ENb, the precharge control signal RASIDLE and the delay locking signal DCC_ENb has a logic high value and, on the other hand, has a logic low value when all of the clock enable signal CLK_ENb, the precharge control signal RASIDLE and the delay locking signal DCC_ENb have a logic low value.

At this time, the clock enable signal CLK_ENb is enabled to a logic low level to allow the source clock CLK, CLKB to be toggled with the predetermined frequency, whereas the clock enable signal CLK_ENb is disabled to a logic high level to allow the source clock CLK, CLKB to be fixed to the predetermined logic level without being toggled. Therefore, when the clock enable signal CLK_ENb is disabled, the duty correcting operation terminating signal DCC_OFF is enabled to the logic high level regardless of logic levels of the precharge control signal RASIDLE and the delay locking signal DCC_ENb.

Meanwhile, the precharge control signal RASIDLE is enabled to a logic high level when the semiconductor memory device enters into a precharge mode and disabled when the semiconductor memory device is relieved of the precharge mode. Thus, when the precharge control signal RASIDLE is enabled, the duty correcting operation terminating signal DCC_OFF is enabled to the logic high level regardless of logic levels of the clock enable signal CLK_ENb and the delay locking signal DCC_ENb.

In the meantime, the delay locking signal DCC_ENb is disabled to a logic high level when the delay locking operation of the delay locking block 200 are not terminated yet, i.e., in the sate of 'before delay locked' and enabled to a logic low level when the delay locking operation of the delay locking block 200 is terminated, i.e., in the state of 'after delay locked'. Therefore, when the delay locking signal DCC_ENb is disabled to the logic high level, the duty correcting operation terminating signal DCC_OFF is enabled to the logic high level regardless of logic levels of the precharge control signal RASIDLE and the clock enable signal CLK_ENb.

Figure 4:
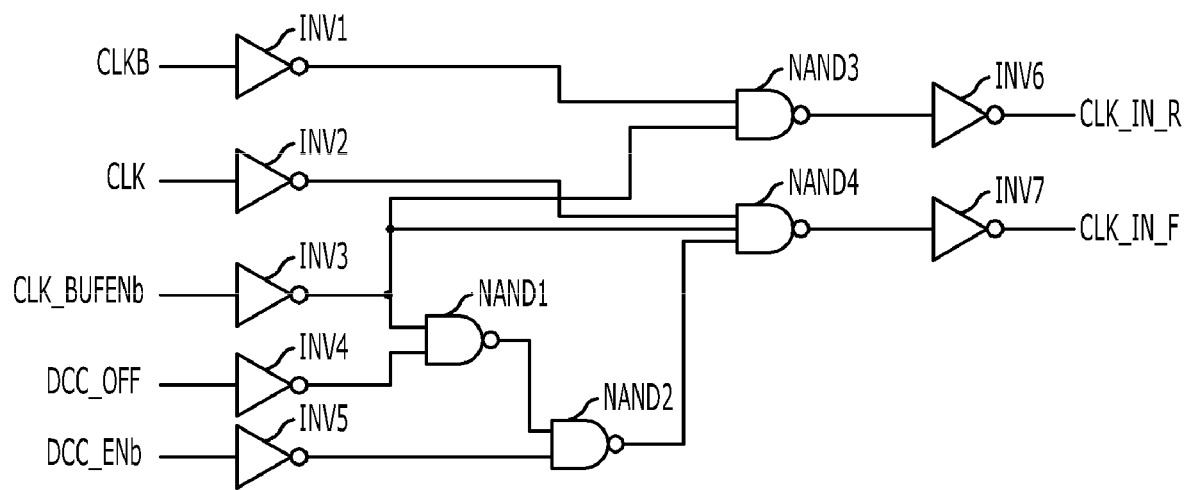
FIG. 4 illustrates a detailed circuit diagram of a clock buffering block described in FIG. 2.

FIG. 4 illustrates a detailed circuit diagram of the clock buffering block 270 described in FIG. 2.

Referring to FIG. 4, the clock buffering block 270 includes a first inverter INV1 for inverting a phase of the negative source clock CLKB, a second inverter INV2 for inverting a phase of the positive source clock CLK, a third inverter INV3 for inverting a phase of the clock buffering control signal CLK_BUFENb, a fourth inverter INV4 for inverting a phase of the duty correcting operation terminating signal DCC_OFF, a fifth inverter INV5 for inverting a phase of the delay locking signal DCC_ENb, a first NAND gate NAND1 for performing a NAND operation on an output signal of the third inverter INV3 and an output signal of the fourth inverter INV4, a second NAND gate NAND2 for performing a NAND operation on an output signal of the first NAND gate NAND1 and an output signal of the fifth inverter INV5, a third NAND gate NAND3 for performing a NAND operation on an output signal of the first inverter INV1 and the output signal of the third inverter INV3, a fourth NAND gate NAND4 for performing a NAND operation on an output signal of the second inverter INV2, the output signal of the third inverter INV3 and an output signal of the second NAND gate NAND2, a sixth inverter INV6 for inverting a phase of an output signal of the third NAND gate NAND3 to output the first internal clock CLK_IN_R and a seventh inverter INV7 for inverting a phase of an output signal of the fourth NAND gate NAND4 to output the second internal clock CLK_IN_F.

Herein, the clock buffering control signal CLK_BUFENb is enabled when it has a logic low level and disabled when it has a logic high level. Therefore, in case that the clock buffering control signal CLK_BUFENb is disabled to the logic high level, the output signal of the third inverter INV3 has a logic low level and thus output signals of the third NAND gate NAND3 and the fourth NAND gate NAND4 are fixed to a logic high level. As a result, when the clock buffering control signal CLK_BUFENb is disabled to the logic high level, the first internal clock CLK_IN_R and the second internal clock CLK_IN_F outputted from the clock buffering block 270 are fixed to a logic low level regardless of the toggling of the source clock CLK, CLKB.

On the other hand, in case that the clock buffering control signal CLK_BUFENb is enabled to the logic low level, since the output signal of the third inverter INV3 has a logic high level, the first internal clock CLK_IN_R is toggled in response to the toggling of the source clock CLKB, whereas it is determined whether the second internal clock CLK_IN_F is toggled in response to the toggling of the source clock CLK or fixed to a certain logic level regardless of the toggling of the source clock CLK, according to logic levels of the duty correcting operation terminating signal DCC_OFF and the delay locking signal DCC_ENb.

In particular, if the delay locking operation of the delay locking block 200 is not terminated yet in a state where the clock buffering control signal CLK_BUFENb is enabled to the logic low level and thus the delay locking signal DCC_ENb is disabled to a logic high level, an output signal of the fifth inverter INV5 has a logic low level and thus the output signal of the second NAND gate NAND2 becomes to have a logic high level, so that the second internal clock CLK_IN_F is toggled in response to the toggling of the source clock CLK. At this time, the duty correcting operation terminating signal DCC_OFF also becomes to have a logic high level in response to the delay locking signal DCC_ENb disabled to the logic high level, so that the output signal of the first NAND gate NAND1 has a logic high level. However, since the output signal of the second NAND gate NAND2 depends on the output signal of the fifth inverter INV5, it does not affect on the result that the second internal clock CLK_IN_F is toggled in response to the toggling of the source clock CLK.

On the other hand, if the delay locking operation of the delay locking block 200 is terminated in a state where the clock buffering control signal CLK_BUFENb is enabled to the logic low level and thus the delay locking signal DCC_ENb is enabled to a logic low level, the output signal of the fifth inverter INV5 becomes to have a logic high level. As a result, whether the second clock CLK_IN_F is toggled in response to the toggling of the source clock CLK or fixed to a certain logic level regardless of the toggling of the source clock CLK is determined in response to a logic level of the duty correcting operation terminating signal DCC_OFF.

That is, in a state where the clock buffering control signal CLK_BUFENb and the delay locking signal DCC_ENb are enabled to the logic low level, if the duty correcting operation terminating signal DCC_OFF becomes to have a logic high level in response to the precharge control signal RASIDLE enabled to a logic high level when the semiconductor memory device enters into the precharge mode or the clock enable signal CLK_ENb disabled to a logic high level wherein the source clock CLK, CLKB is fixed to the predetermined logic level without being toggled, the output signal of the first NAND gate NAND1 becomes to have a logic high level and thus the output signal of the first NAND gate NAND1 together with the output signal of the fifth inverter INV5 having a logic high level make the output signal of the second NAND gate NAND2 become a logic low level. As a result, the second internal clock CLK_IN_F is fixed to a logic low level regardless of the toggling of the source clock CLK.

However, if, in a state where the clock buffering control signal CLK_BUFENb and the delay locking signal DCC_ENb are enabled to the logic low level, the semiconductor memory device is relieved of the precharge mode, and thus the precharge control signal RASIDLE is disabled to a logic low level; and the clock enable signal CLK_ENb is enabled to a logic low level, and thus the source clock CLK, CLKB is toggled with the predetermined frequency, the duty correcting operation terminating signal DCC_OFF becomes to have a logic low level The output signal of the first NAND gate NAND1 becomes to have a logic low level and thus the output signal of the second NAND gate NAND2 becomes to have a logic high level. As a result, the second internal clock CLK_IN_F is toggled in response to the toggling of the source clock CLK.

With reference to the construction described above, an operation of the DLL circuit in accordance with the embodiment of the present invention will be explained hereinafter.

First of all, the operation of the inventive DLL circuit may be also classified into an operation of 'before delay locked' and an operation of 'after delay locked' like the operation of the conventional DLL circuit.

In a state of 'before delay locked', the delay locking signal DCC_ENb is disabled to a logic high level and thus the duty correcting operation terminating signal DCC_OFF is unconditionally enabled to a logic high level. That is, the operation of 'before delay locked' is completely identical to that of the conventional DLL circuit. Therefore, the operation of 'after delay locked' is only explained herein.

Referring to the operation of 'after delay locked' of the DLL circuit in accordance with the embodiment of the present invention, since the delay locking signal DCC_ENb is enabled to a logic low level, a logic level of the duty correcting operation terminating signal DCC_OFF is determined according to logic levels of the precharge control signal RASIDLE and the clock enable signal CLK_ENb, and an operation of mixing that phases of the first delay locking clock RISING_CLK and the second delay locking clock FALLING_CLK in the duty correcting block 240 and an operation of generating the second internal clock CLK_IN_F in the clock buffering block 270 may be controlled according to the logic level of the duty correcting operation terminating signal DCC_OFF.

In particular, in the operation of 'after delay locked', if the semiconductor memory device is relieved of the precharge mode, the precharge control signal RASIDLE is disabled to a logic low level. Further, if the clock enable signal CLK_ENb is enabled to a logic low level and thus the source clock CLK, CLKB is toggled with the predetermined frequency, the duty correcting operation terminating signal DCC_OFF becomes to have a logic low level that is the same as that of the delay locking signal DCC_ENb. The duty correcting block 240 mixes the phases of the first delay locking clock RISING_CLK and the second delay locking clock FALLING_CLK and the clock buffering block 270 generates the first internal clock CLK_IN_R and the second internal clock CLK_IN_F. That is, the operation of 'after delay locked' is absolutely the same as that of the conventional DLL circuit.

On the other hand, in the operation of 'after delay locked', if the semiconductor memory device enters into the precharge mode and thus the precharge control signal RASIDLE is enabled to a logic high level, or the clock enable signal CLK_ENb is disabled to a logic high level and thus the source clock CLK, CLKB is not toggled with the predetermined frequency and fixed to a certain logic level, the duty correcting operation terminating signal DCC_OFF becomes to have a logic high level that is opposite to the logic level of the delay locking signal DCC_ENb. The duty correcting block 240 does not perform the operation of mixing the phases of the first delay locking clock RISING_CLK and the second delay locking clock FALLING_CLK and the clock buffering block 270 generates only the first internal clock CLK_IN_R except the second internal clock CLK_IN_F.

That is, unlike in the conventional DLL circuit, in the situation where the semiconductor memory device enters into the precharge mode in the operation of 'after delay locked' and thus the precharge control signal RASIDLE is enabled to a logic high level, or the clock enable signal CLK_ENb is disabled to a logic high level and thus the source clock CLK, CLKB is fixed to the certain logic level without being toggled, the DLL circuit in accordance with this embodiment of the present invention can inactivate the duty correcting block 240 as well as controlling the second internal clock CLK_IN_F to be fixed to a specific logic level in the clock buffering block 270. As a result, in the DLL circuit, the components such as the second phase comparing unit 2042, the second delay line 2044 and the second delay modeling sector 205 through which the second internal clock CLK_IN_F passes do not perform any operation. Therefore, it is possible to prevent the current consumption due to the operation of the duty correcting block 240 and the components in the DLL circuit through which the second internal clock CLK_IN_F passes.

As depicted above, in accordance with the embodiment of the present invention, by controlling the operation of correcting the duty ratio to be performed only in the operation of reading data in case of the DLL circuit employing the duel loop scheme in the state of 'after delay locked', the current consumption due to the operation of correcting the duty ratio of the DLL circuit may be minimized.

While the present invention has been described with respect to the specific embodiments, it will be apparent to those skilled in the art that various changes and modifications may be made without departing from the spirit and scope of the invention as defined in the following claims.

For instance, in the above embodiments, the illustrated logic gates and transistors may be implemented to have different locations and types according to polarities of signals inputted thereto.

What is claimed is:

1. A delay locked loop circuit, comprising:
   a clock buffering block configured to generate first and second internal clocks corresponding to first and second edges of a source clock in response to a clock buffering control signal, respectively, wherein the activation of the operation of generating the second internal clock is controlled in response to a duty correcting operation terminating signal and a delay locking signal;
   a delay locking block configured to compare phases of the first and second internal clocks with those of first and second feedback clocks, respectively, to enable the delay locking signal according to a delay locking, and delay the first and second internal clocks as much as times corresponding to the comparison results, respectively, thereby outputting first and second delay locking clocks;
   a duty correcting block configured to mix phases of the first and second delay locking clocks in an inactivation period of the duty correcting operation terminating signal; and
   a first signal generating block configured to generate the duty correcting operation terminating signal in response to a clock enable signal, a precharge control signal and the delay locking signal.

2. The delay locked loop circuit of claim 1, further comprising:
   a second signal generating block configured to generate the clock buffering control signal in response to the clock enable signal, the precharge control signal and a power down mode entry control signal.

3. The delay locked loop circuit of claim 2, wherein the source clock is toggled with a predetermined frequency in an activation period of the clock enable signal and fixed to a preset logic level in an inactivation period of the clock enable signal.

4. The delay locked loop circuit of claim 1, wherein the clock buffering block is further configured to toggle the first and second internal clocks when the delay locking signal is disabled and the clock buffering control signal is enabled.

5. The delay locked loop circuit of claim 4, wherein the clock buffering block is further configured to toggle the first and second internal clocks in response to the inactivation of the duty correcting operation terminating signal and fix the second internal clock to a predetermined logic level while togging the first internal clock in response to the activation of the duty correcting operation terminating signal, when the delay locking signal is enabled and the clock buffering control signal is enabled.

6. The delay locked loop circuit of claim 1, wherein the clock buffering block is further configured to fix the first and second internal clocks to predetermined logic levels when the clock buffering control signal is disabled.

7. The delay locked loop circuit of claim 1, wherein the first signal generating block is further configured to enable the duty correcting operation terminating signal regardless of logic levels of the precharge control signal and the delay locking signal in response to the inactivation of the clock enable signal.

8. The delay locked loop circuit of claim 1, wherein the first signal generating block is further configured to enable the duty correcting operation terminating signal regardless of logic levels of the clock enable signal and the delay locking signal in response to the activation of the precharge control signal.

9. The delay locked loop circuit of claim 1, wherein the first signal generating block is further configured to enable the duty correcting operation terminating signal regardless of logic levels of the precharge control signal and the clock enable signal in response to the inactivation of the delay locking signal.

10. The delay locked loop circuit of claim 1, wherein the delay locking block includes:
    a first phase delaying sector configured to compare the phase of the first internal clock with that of the first feedback clock and delay the phase of the first internal clock as much as the time determined corresponding to said comparison result, thereby outputting the first delay locking clock;
    a second phase delaying sector configured to compare the phase of the second internal clock with that of the second feedback clock and delay the phase of the second internal clock as much as the time determined corresponding to said comparison result, thereby outputting the second delay locking clock;
    a first delay modeling sector configured to output the first feedback clock by reflecting a delay time of a practical output path to the first delay locking clock; and
    a second delay modeling sector configured to output the second feedback clock by reflecting a delay time of a practical output path to the second delay locking clock.

11. The delay locked loop circuit of claim 1, wherein the duty correcting block includes:
    a phase detecting sector configured to detect a phase difference between the first delay locking clock and the second delay locking clock in the inactivation period of the duty correcting operation terminating signal; and
    a phase mixing sector configured to mix the phases of the first and second delay locking clocks with a mixing weight corresponding to an output signal of the phase detecting sector in the inactivation period of the duty correcting operation terminating signal.

12. The delay locked loop circuit of claim 1, further comprising a third signal generating block configured to generate the delay locking signal in response to a first locking signal corresponding to whether the first delay locking clock is delay-locked or not and a second locking signal corresponding to whether the second delay locking clock is delay-locked or not.

13. An operational method of a delay locked loop circuit, the method comprising:
generating first and second internal clocks corresponding to first and second edges of a source clock in response to a clock buffering control signal before a delay-locked;
generating the first internal clock in response to the clock buffering control signal and the second internal clock in response to the clock buffering control signal and a duty correcting operation terminating signal after the delay-locked;
generating the duty correcting operation terminating signal in response to a precharge control signal and a clock enable signal after the delay-locked;
outputting first and second delay locking clocks by comparing phases of the first and second internal clocks with those of first and second feedback clocks and reflecting delay values for the delay-locked corresponding to comparison results to the first and second internal clocks, respectively; and
mixing phases of the first and second delay locking clocks in an inactivation period of the duty correcting operation terminating signal.

14. The method of claim 13, wherein the generating the first and second internal clocks after the delay-locked includes:
toggling the first internal clock in response to the activation of the clock buffering control signal;
toggling the second internal clock in response to the inactivation of the duty correcting operation terminating signal when the clock buffering control signal is enabled;
fixing the second internal clock to a preset logic level in response to the activation of the duty correcting operation terminating signal when the clock buffering control signal is enabled; and
fixing the first and second internal clocks to preset logic levels in response to the inactivation of the clock buffering control signal.

15. The method of claim 13, wherein the generating the duty correcting operation terminating signal after the delay-locked includes:
enabling the duty correcting operation terminating signal in response to the activation of the precharge control signal; and
enabling the duty correcting operation terminating signal in response to the inactivation of the clock enable signal.

16. The method of claim 13, wherein the outputting the first and second delay locking clocks includes:
outputting the first delay locking clock by comparing the phase of the first internal clock with that of the first feedback clock and delaying the phase of the first internal clock as much as a time corresponding to the comparison result;
outputting the second delay locking clock by comparing the phase of the second internal clock with that of the second feedback clock and delaying the phase of the second internal clock as much as a time corresponding to the comparison result;

outputting the first feedback clock by reflecting a delay time of a practical output path to the first delay locking clock; and
outputting the second feedback clock by reflecting a delay time of a practical output path to the second delay locking clock.

17. The method of claim 13, wherein the mixing the phases of the first and second delay locking clocks includes:
detecting a phase difference between the first delay locking clock and the second delay locking clock in the inactivation period of the duty correcting operation terminating signal; and
mixing the phases of the first and second delay locking clocks with a mixing weight corresponding to the detection result in the inactivation period of the duty correcting operation terminating signal.

18. A delay locked loop circuit, comprising:
a first clock buffering block configured to generate a first internal clock corresponding to a first edge of a source clock in response to a clock buffering control signal;
a second clock buffering block configured to generate a second internal clock corresponding to a second edge of the source clock in response to the clock buffering control signal, which is controlled in response to a duty correcting operation terminating signal and a delay locking signal;
a first delay locking block configured to compare a phase of the first internal clock with that of a first feedback clock to enable a first locking signal according to a delay locking and output a first delay locking clock by delaying the first internal clock as much as a time corresponding to the comparison result;
a second delay locking block configured to compare a phase of the second internal clock with that of a second feedback clock to enable a second locking signal according to a delay locking and output a second delay locking clock by delaying the second internal clock as much as a time corresponding to the comparison result;
a duty correcting block configured to mix a phase of the first delay locking clock and that of the second delay locking clock in an inactivation period of the duty correcting operation terminating signal;
a first signal generating block configured to generate the duty correcting operation terminating signal in response to a clock enable signal, a precharge control signal and the delay locking signal; and
a second signal generating block configured to generate the delay locking signal in response to the first and second locking signals.

19. The delay locked loop circuit of claim 18, further comprising:
a third signal generating block configured to generate the clock buffering control signal in response to the clock enable signal, the precharge control signal and a power down mode entry control signal.

20. The delay locked loop circuit of claim 18, wherein the source clock is toggled with a predetermined frequency in an activation period of the clock enable signal and fixed to a preset logic level in an inactivation period of the clock enable signal.

21. The delay locked loop circuit of claim 18, wherein the first clock buffering block is further configured to toggle the first internal clock when the clock buffering control signal is enabled and fixes the first internal clock to a preset logic level when the clock buffering control signal is disabled.

22. The delay locked loop circuit of claim 18, wherein the second clock buffering block is further configured to toggle the second internal clock when the delay locking signal is disabled and the clock buffering control signal is enabled.

23. The delay locked loop circuit of claim 22, wherein the second clock buffering block is further configured to toggle the second internal clock in response to the inactivation of the duty correcting operation terminating signal and fixes the second internal clock to a predetermined logic level in response to the activation of the duty correcting operation terminating signal, when the delay locking signal is enabled and the clock buffering control signal is enabled.

24. The delay locked loop circuit of claim 18, wherein the second clock buffering block is further configured to fix the second internal clock to the predetermined logic level when the clock buffering control signal is disabled.

25. The delay locked loop circuit of claim 18, wherein the first signal generating block is further configured to enable the duty correcting operation terminating signal regardless of logic levels of the precharge control signal and the delay locking signal in response to the inactivation of the clock enable signal.

26. The delay locked loop circuit of claim 18, wherein the first signal generating block is further configured to enable the duty correcting operation terminating signal regardless of logic levels of the clock enable signal and the delay locking signal in response to the activation of the precharge control signal.

27. The delay locked loop circuit of claim 18, wherein the first signal generating block is further configured to enable the duty correcting operation terminating signal regardless of logic levels of the precharge control signal and the clock enable signal in response to the inactivation of the delay locking signal.

28. The delay locked loop circuit of claim 18, wherein the first delay locking block includes:
 a first phase delaying sector configured to compare the phase of the first internal clock and that of the first feedback clock and delay the phase of the first internal clock as much as a time determined corresponding to the comparison result, thereby outputting the first delay locking clock; and
 a first delay modeling sector configured to output the first feedback clock by reflecting a delay time of a practical output path to the first delay locking clock.

29. The delay locked loop circuit of claim 28, wherein the second delay locking block includes:
 a second phase delaying sector configured to compare the phase of the second internal clock and that of the second feedback clock and delay the phase of the second internal clock as much as a time determined corresponding to the comparison result, thereby outputting the second delay locking clock; and
 a second delay modeling sector configured to output the second feedback clock by reflecting a delay time of a practical output path to the second delay locking clock.

30. The delay locked loop circuit of claim 18, wherein the duty correcting block includes:
 a phase detecting sector configured to detect a phase difference between the first delay locking clock and the second delay locking clock in the inactivation period of the duty correcting operation terminating signal; and
 a phase mixing sector configured to mix the phases of the first and second delay locking clocks with a mixing weight corresponding to an output signal of the phase detecting sector in the inactivation period of the duty correcting operation terminating signal.

* * * * *

UNITED STATES PATENT AND TRADEMARK OFFICE
CERTIFICATE OF CORRECTION

| | | |
|---|---|---|
| PATENT NO. | : 7,915,934 B2 | Page 1 of 1 |
| APPLICATION NO. | : 12/427028 | |
| DATED | : March 29, 2011 | |
| INVENTOR(S) | : Young-Jun Ku | |

It is certified that error appears in the above-identified patent and that said Letters Patent is hereby corrected as shown below:

On the title page change FOREIGN PATENT DOCUMENTS portion of item (56) for References Cited as follows:

FOREIGN PATENT DOCUMENTS

KR       100815185    3/2008
KR       100857855    9/2008
KR   1020080088158  10/2008

Signed and Sealed this
Twenty-sixth Day of April, 2011

David J. Kappos
*Director of the United States Patent and Trademark Office*